(12) United States Patent
Heike et al.

(10) Patent No.: US 7,799,701 B2
(45) Date of Patent: Sep. 21, 2010

(54) METHOD OF COATING SUBSTRATE

(75) Inventors: Seiji Heike, Kawagoe (JP); Tomihiro Hashizume, Hatoyama (JP); Masayoshi Ishibashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 218 days.

(21) Appl. No.: 12/153,995

(22) Filed: May 28, 2008

(65) Prior Publication Data

US 2008/0299292 A1 Dec. 4, 2008

(30) Foreign Application Priority Data

May 29, 2007 (JP) .............................. 2007-141271

(51) Int. Cl.
  *H01L 21/31* (2006.01)
(52) U.S. Cl. ............................... 438/758; 427/9; 427/10
(58) Field of Classification Search .................... 427/9, 427/10; 438/758; 347/55
  See application file for complete search history.

(56) References Cited

U.S. PATENT DOCUMENTS

2005/0272212 A1* 12/2005 Ho et al. ...................... 438/301
2008/0225087 A1*  9/2008 Lee et al. ....................... 347/55

* cited by examiner

*Primary Examiner*—Charles D Garber
*Assistant Examiner*—Reema Patel
(74) *Attorney, Agent, or Firm*—Stites & Harbison, PLLC; Juan Carlos A. Marquez, Esq.

(57) ABSTRACT

A method of coating by supplying a liquid material from a nozzle tip to form a film on a substrate surface facing to the nozzle, having the steps of: preparing a translation mechanism, which is capable of moving the nozzle in an in-plane direction and in a thickness direction of the substrate; making the nozzle to come gradually closer to the substrate, after positioning of the nozzle on the in-plane of the substrate, by using the translation mechanism; detecting electric current flowing through the nozzle from the substrate surface, when a semiconductor droplet supplied from the nozzle tip contacts with an electrode installed at the substrate surface; stopping accession of the nozzle to the substrate, when the electric current exceeds threshold value set in advance; and making the nozzle tip apart from the substrate farther than in the stopping, so as to coat the substrate with the liquid material.

4 Claims, 3 Drawing Sheets ent application claims priority from Japanese application JP 2007-141271 filed on May 29, 2007, the content of which is hereby incorporated by reference into this application.

BACKGROUND OF THE INVENTION

The present invention relates to a method of coating, in particular, relates to a method of coating with a liquid material by supplying the liquid material from a nozzle to a substrate surface, so as to form a film on the substrate surface.

In a conventional apparatus and method of coating, by moving a substrate, in a state that a nozzle is made to come close to a predetermined distance from the substrate surface in advance, in an X-Y direction (a direction extending in-plane of the substrate) toward the nozzle, and discharging a coating liquid from the nozzle tip, by applying the pressure to the coating liquid in a syringe, when the nozzle reaches a desired position, so as to form a desired coating film pattern at the substrate surface.

Distance between the nozzle (tip) and the substrate is adjusted manually or automatically in a degree for a droplet, which is formed at the nozzle tip in discharging the coating liquid, to contact with the substrate surface.

In addition, there is also an apparatus installed with a distance sensor using a laser interferometer or the like, between the nozzle side and the substrate side, in order to maintain distance between the nozzle tip and the substrate surface just under the nozzle, in consideration of the case where the substrate is inclined toward an X-Y positioning stage.

SUMMARY OF THE INVENTION

In the conventional apparatus and method of coating, operation is carried out based on the premise that the substrate surface is flat, and in the case where there is a local concave-convex at the substrate surface, or the substrate is curved by warpage or the like, distance between the nozzle tip and the substrate surface becomes not constant.

In addition, even in the case where the distance sensor is installed, in practice, a mounting position of the sensor is apart from the nozzle tip, which makes impossible to correctly detect the distance between the nozzle tip and the substrate surface.

Therefore, in the case where the concave-convex of the substrate surface or the curvature is present within a range smaller than displacement of a sensing position and the nozzle tip position, it is difficult to maintain the distance between the nozzle tip and the substrate surface as a predetermined way.

The present invention is made in consideration of the phenomenon that, in the case where the substrate and the nozzle have electric conductivity, weak electric current flows between the nozzle and the substrate, when a droplet of the coating liquid formed at the nozzle tip contacts with the substrate surface.

When there is formed a bridge between the nozzle and the substrate by the coating liquid in making the nozzle close to the substrate, because the coating liquid is generally an electrolyte, electric current flows by ion conduction or the like via the coating liquid, in the case where potential difference is present by application of voltage between the nozzle and the substrate, or the like.

Because this electric current flows at the moment when the coating liquid contacts with the substrate, the contact between the substrate and the droplet can be detected, by forming a droplet at the nozzle tip in advance, without contact of the nozzle itself with the substrate.

When the droplet contacts with the substrate, the coating liquid is drawn out from the nozzle by surface tension of the droplet on the substrate, resulting in continuously supplying the coating liquid from the nozzle to the substrate surface.

Therefore, by adjusting period from detecting the droplet contact to making the nozzle apart from the substrate, amount or coating surface with the coating liquid to be supplied can be controlled.

According to the present invention, there is advantage that stable coating with the coating liquid can be carried out without contacting the nozzle and the substrate, even toward the substrate surface where the concave-convex or the curvature is present.

Other objects, features and advantages of the invention will become apparent from the following description of the embodiments of the invention taken in conjunction with the accompanying drawings.

DESCRIPTION OF THE EMBODIMENTS

Explanation will be given below on Embodiments of the invention relevant to a coating apparatus.

First, explanation will be given below on constitution of the coating apparatus.

Figure 1:
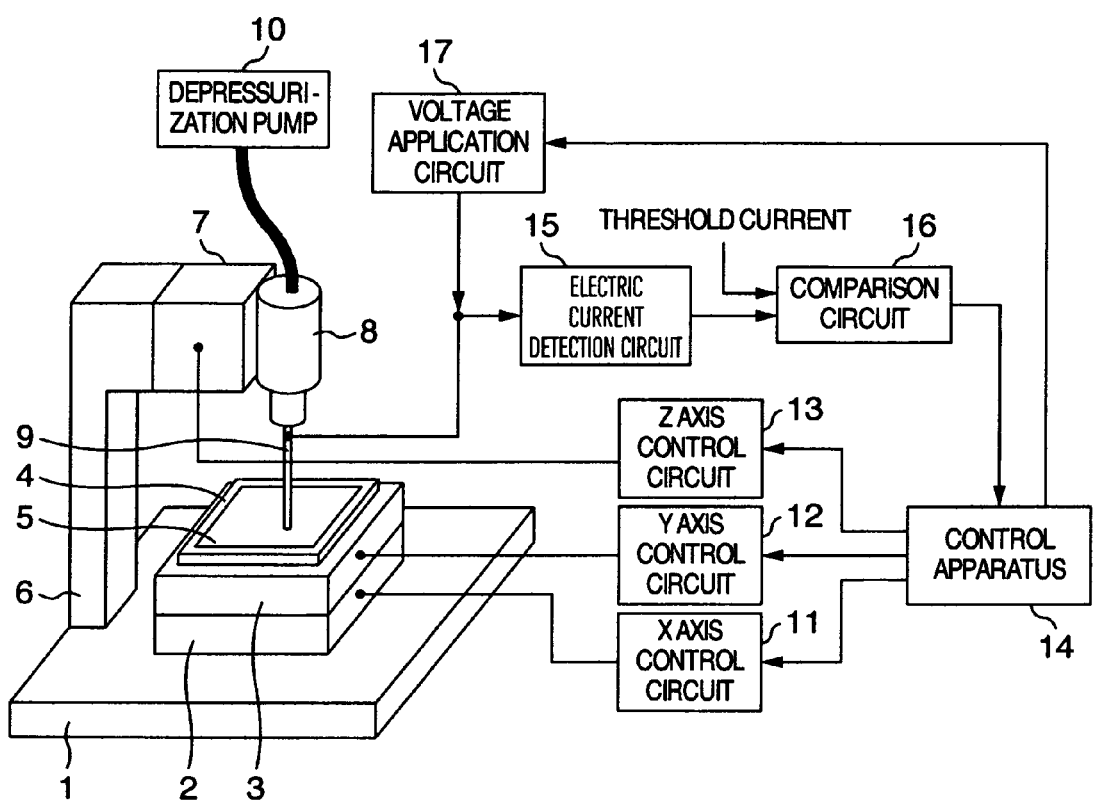
FIG. 1 is a configuration view showing an embodiment of a coating apparatus relevant to the present invention.

FIG. 1 is a configuration view showing an embodiment of a coating apparatus relevant to the present invention.

An X translation mechanism 2 is fixed on a pedestal 1, a Y translation mechanism 3 is attached on the X translation mechanism 2, and still more, a substrate 4 is attached on the Y translation mechanism 3, so as to enable free operation of the substrate 4 in an in-plane direction (an X-Y direction) of the pedestal 1.

Upper and lower sides of the X translation mechanism 2 and the Y translation mechanism 3 may be exchanged.

In addition, a conductive electrode pattern 5 is installed on the substrate 4.

A support 6 is fixed at the pedestal 1, and a Z translation mechanism 7 is attached at the upper end of the support 6.

A syringe 8 is fixed at the Z translation mechanism 7, and the syringe 8 has a nozzle 9 so that the tip thereof faces to the substrate 4, by which the syringe 8 and the nozzle 9 are capable of making up and down motion in a direction perpendicular to the surface (an X-Y direction) of the substrate 4.

Inside of the syringe 8 is depressurized by a decompression pump 10, so as to prevent the nozzle 9 from leaking the coating material in the syringe 8.

The X translation mechanism 2, the Y translation mechanism 3 and the Z translation mechanism 7 are driven by an X-axis drive circuit 11, a Y-axis drive circuit 12 and a Z-axis drive circuit 13, respectively, and are capable of moving the nozzle tip 9 to desired X, Y and Z coordinates for the substrate 4, by a control apparatus 14.

To the conductive nozzle 9, an electric current detection circuit 15 is connected, and the detected electric current is compared with threshold value of the electric current set in advance by a comparison circuit 16, and the result is read by the control apparatus 14.

In addition, to the nozzle 9, a voltage application circuit 17 is also connected, and voltage is applied to the nozzle 9 in advance, if necessary.

Then, explanation will be given on coating operation by a coating apparatus.

First, in a state that the nozzle 9 and the substrate surface 4 are sufficiently apart so as not to contact each other, the control apparatus 14 operates the X translation mechanism 2 and the Y translation mechanism 3 via the X-axis drive circuit 11 and the Y-axis drive circuit 12, and transfers the substrate 4 so that the nozzle tip 9 comes just above the place to be coated on the substrate 4.

Then, the Z translation mechanism 7 is operated via the Z drive circuit 13 to make the nozzle tip 9 close to the substrate 4.

In this case, electric current flowing through the nozzle 9 is monitored by the electric current detection circuit 15, and this electric current value is compared with the set threshold electric current and comparative circuit 16, to be checked whether or not the electric current flowing through the nozzle 9 exceeds the threshold value, by the control apparatus 14.

In the case where the electric current value exceeds the threshold value, operation of the Z translation mechanism 7 is immediately stopped, and after the position of the nozzle 9 is stopped for a time set in advance, the Z translation mechanism 7 is operated again to make the nozzle 9 apart from the substrate surface 4 by predetermined distance.

By repeating this procedure at a coordinate position to be coated on the substrate 4, a desired coated film pattern is formed.

Explanation will be given below on operation of a nozzle and behavior of a coating liquid in coating.

Figure 2:
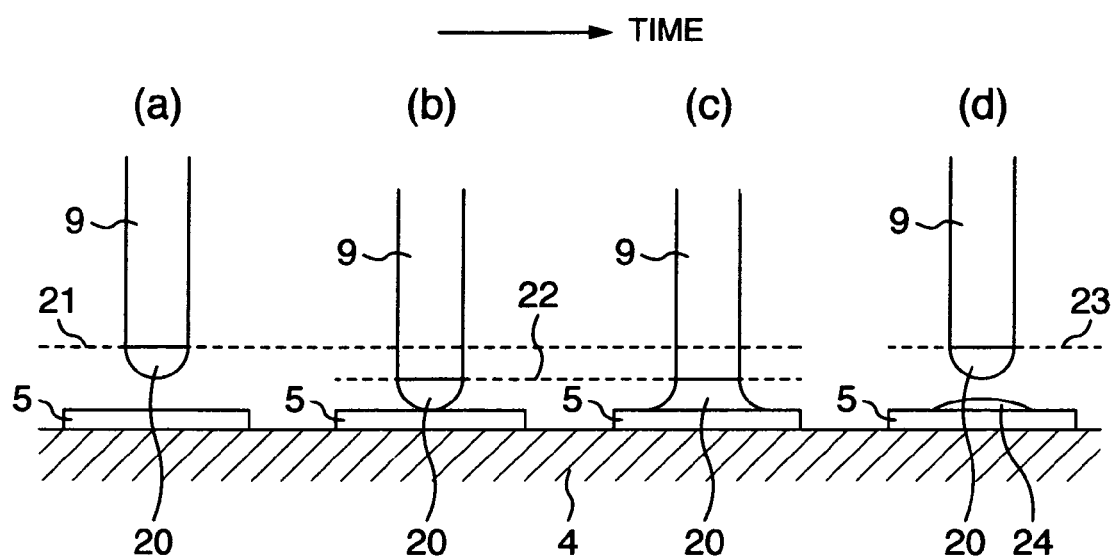
FIG. 2 is a side view showing time series of state supplying a coating liquid onto a substrate from a nozzle tip relevant to the present invention.

FIG. 2 is a side view showing time series of a supplying state of the coating liquid onto a substrate from the nozzle tip.

A coating material is charged in the syringe 8, and by subjecting this material to decompression by using the decompression pump 10, a hemisphere-like droplet 20 as shown in (a) of FIG. 2, is formed.

Before the coating, the nozzle tip 9 is at a position 21 apart from the electrode pattern 5 on the substrate surface 4 by a certain distance, and the nozzle 9 is made to come gradually closer to the surface of the electrode pattern 5, by using the Z translation mechanism 7, with the start of coating operation.

As shown in (b) of FIG. 2, electric current flows between the nozzle 9 and the electrode pattern 5, at the moment of contacting of the droplet 20 with the surface of the electrode pattern 5, and by detection of this electric current, the nozzle 9 is stopped at a position 22.

After the contact of the droplet 20, the coating liquid is drawn to the surface of the electrode pattern 5 by surface tension, and as shown by (c) of FIG. 2, a bridged state is obtained between the nozzle tip 9 and the surface of the electrode pattern 5.

In this state, because the coating liquid in the droplet 20 is drawn by surface tension to the electrode pattern 5, the coating liquid is continuously supplied from the nozzle 9, and contact area between the electrode pattern 5 and the droplet 20 increases with time.

After a certain period has passed from detection of electric current, by making the nozzle 9 apart from the position 22 to a position 23 by a certain distance, a coating pattern 24, as shown by (d) of FIG. 2, is formed on the electrode pattern 5.

By adjustment of contact time between the droplet 20 and the surface of the electrode pattern 5, size of the coating pattern 24 can be controlled.

In addition, the position 23 may be the same constant value as the position 21, not depending on the position 22, and in this case, the position 21 should be the position sufficiently apart from the substrate surface 4, in consideration of the concave-convex of the substrate 4.

Explanation will be given on behavior of electric current flowing in contacting a droplet and a substrate surface, and a detecting method therefor.

Figure 3:
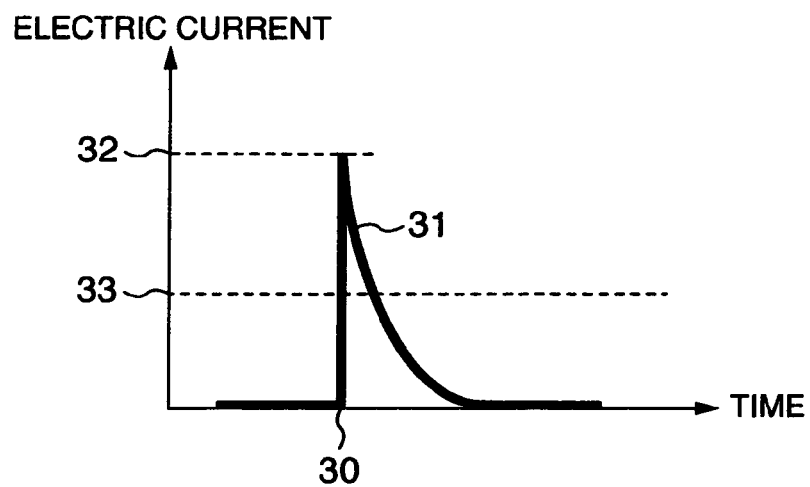
FIG. 3 is a graph showing time change of electric current flowing when a droplet and a substrate surface, relevant to the present invention, are contacted.

FIG. 3 is a graph showing schematically an electric current state flowing when the droplet and the substrate surface are contacted, with the electric current as a vertical axis, and the time as a horizontal axis.

In the case where the electrode pattern 5 exposed on the substrate 4 is not electrically connected, the electrode pattern 5 is usually charged, and potential difference is generated between the electrode pattern 5 and the nozzle 9.

Therefore, in the case where the droplet 20 at the nozzle tip 9 and the surface of the electrode pattern 5 are contacted at a time 30, electric current flows via the droplet 20, which is an electrolyte.

However, because a charge amount in the electrode pattern 5 is finite, the charge amount decreases with time, and electric current also decreases therewith.

When potentials of the nozzle 9 and the electrode pattern 5 become finally equal, no electric current flows, and as a whole, transient current flows, as shown by an electric current waveform 31 in FIG. 3. Time constant of attenuation of the electric current waveform 31 is determined by electric capacitance between the nozzle 9 and the electrode pattern 5, and electric resistance of the droplet 20, and a peak electric current value 32 appearing at the time 30 is determined by potential difference between the nozzle 9 and the electrode pattern 5, and electric resistance of the droplet 20.

By setting a threshold electric current value 33 in detection of the electric current in advance, for example, as shown in FIG. 3, contact between the droplet 20 and the surface of the electrode pattern 5 can be detected.

It is necessary to set the threshold electric current value 33 to be smaller than the peak electric current value 32, and in addition, to be sufficiently larger than a noise level of the electric current detection circuit 15, in order to prevent improper operation.

In addition, in order to increase the peak electric current value 32, it may be set that the nozzle 9 is applied with constant voltage by using a voltage application circuit 17.

After the contact, charge in the electrode pattern 5 is discharged, however, because of quick charging by leak electric current from the circumference, there is no problem in the subsequent coating operation.

Then explanation will be given on constitution of a coating apparatus, in the case where electric connection is possible to the electrode pattern on the substrate.

Figure 4:
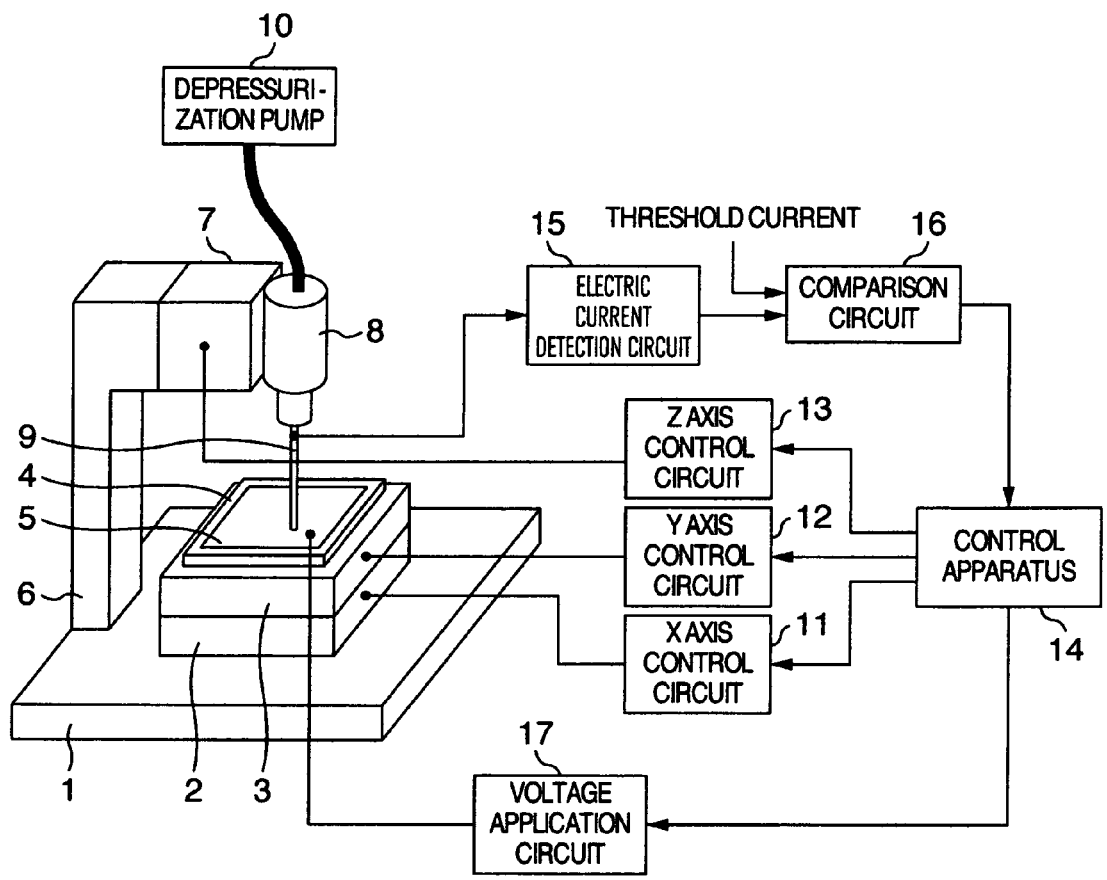
FIG. 4 is a configuration view showing an embodiment of a coating apparatus relevant to other Embodiment of the present invention.

FIG. 4 is a configuration view showing an embodiment of a coating apparatus of the present invention.

The configuration shown in FIG. 4 is same as the configuration shown in FIG. 1 but different in that the voltage application circuit 17 is connected to the electrode pattern 5 instead of the nozzle 9.

Coating operation is also about the same as in the coating apparatus having the constitution of FIG. 1, as well as operation of the nozzle in coating, and behavior of the coating liquid are also same as in FIG. 2.

However, because a certain voltage is applied, in advance, to the electrode pattern 5, toward the nozzle 9, steady-state current flows, instead of transient current as shown in FIG. 3, during the contact between the electrode pattern 5 and the droplet 20, as shown in (b) and (c) of FIG. 2.

Figure 5:
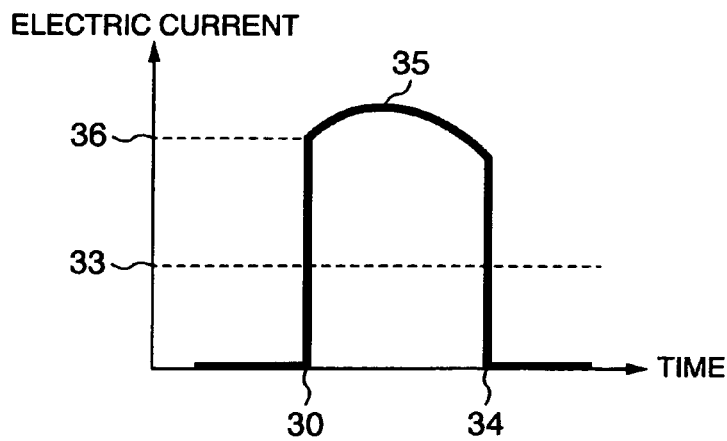
FIG. 5 is a graph showing time change of electric current flowing when a droplet and a substrate surface, relevant to other Embodiment of the present invention, are contacted.

FIG. 5 is a graph schematically showing an electric current state flowing when the droplet and the substrate surface are contacted, with the electric current as a vertical axis, and the time as a horizontal axis.

Because voltage is applied to the electrode pattern 5, in the case where the droplet 20 at the nozzle tip 9 and the surface of the electrode pattern 5 are contacted at a time 30, electric current flows via the droplet 20.

Because this electric current flows continuously during the contact between the droplet 20 and the electrode pattern 5, electric current such as shown by an electric current waveform 35 results in to flow, till the droplet 20 and the electrode pattern 5 are apart in time 34.

Because electric current value depends on a shape of a droplet, it does not necessarily take constant value.

By setting the threshold electric current value 33 in detection of the electric current in advance, for example, as shown in FIG. 3, contact between the droplet 20 and the surface of the electrode pattern 5 can be detected.

It is necessary to set the threshold electric current value 33 to be smaller than an initial electric current value 36 flowing in contacting time between the droplet 20 and the electrode pattern 5, that is, at the time 30, and in addition, to be sufficiently larger than a noise level of the electric current detection circuit 15, in order to prevent improper operation.

In order to increase the initial electric current value 36, it is enough to increase voltage applied to the electrode pattern 5.

In addition, in a coating apparatus having the configuration as shown in FIG. 1, coating operation same as that in the coating apparatus as shown in FIG. 4 can be carried out, even when the electrode pattern 5 is connected to earth potential.

Embodiment 1

Explanation will be given in detail on the present invention using the following Embodiments.

By using a coating apparatus of the present invention, and by coating with a semiconductor material on a flexible substrate made of a plastic material installed with an electrode, a field effect transistor (FET) is prepared. As the flexible substrate, a polyethylene terephthalate (PET) substrate having a thickness of 0.1 mm, and a diameter of 75 mm, is used.

There are deposited thereon, aluminum with a thickness of 200 nm as a gate electrode; silicon oxide with a thickness of 300 nm as a gate oxide film; and furthermore, gold with a thickness of 200 nm as a source and drain electrodes; in this order.

As the semiconductor material for coating, a chloroform solution of poly(3-hexylthiophene) (P3HT) is used.

At the substrate surface, the source electrode and the drain electrode having a size of 400 μm×500 μm, are exposed via a gap of 30 μm, and using this as an element, 20 ×20 pieces of arrays are set in a pitch of 2 mm.

By using a coating apparatus of the present invention, and by coating with the semiconductor on the gap between the source electrode and the drain electrode, the FET is prepared.

By fixing the substrate on an X-Y drive mechanism of a stepping motor drive, a syringe containing the P3HT solution was fixed to a Z drive mechanism of the stepping motor drive.

At the syringe, a nozzle having a diameter of 0.23 mm is attached, and the nozzle tip part is designed to be able to freely transfer in any direction of X, Y and Z, toward the substrate surface.

First, a decompression pump was adjusted so that a hemisphere-like droplet of the solution of P3HT is formed at the nozzle tip.

By maintaining pressure after the adjustment, the droplet with the same shape is always formed at the nozzle tip, even when the solution of P3HT in a syringe is reduced.

Then, by moving a nozzle onto an element to be coated first by manual, the nozzle is adjusted so as to come at the center of the gap between the source electrode and the drain electrode.

In this case, distance from the substrate surface to the nozzle tip was set to about 5 mm, however, the distance may be any value as long as the substrate and the nozzle tip are not contacted.

After this, subsequent operation was carried out automatically according to a program, and operated by the procedure to be described below.

By making the nozzle to come gradually closer to the substrate surface, and when electric current is detected, the accession of the nozzle is stopped.

After making the nozzle apart from the position in a Z direction by a certain distance, then it is transferred to the next coating position in an X-Y direction.

Because pitch of an element array is known in advance, by moving the nozzle in an X direction or in a Y direction by that pitch, correct transfer to the next position of the gap between the source electrode and the drain electrode is secured.

By repeating a similar operation, under raster scanning in an X-Y direction, all of the 20×20 pieces of array elements are coated with the semiconductor.

When voltage applied to the nozzle was 0 V, since peak electric current flowing in contacting of the substrate surface and the nozzle tip was about 100 nA and noise level of the electric current detection circuit was about 10 nA, a threshold electric current value for detection of the contact is set to be 50 nA.

Electric current value to be detected varies depending on a substrate material or an electrode size, however, it is desirable that the threshold electric current value is about intermediate between the peak electric current and the noise level.

In the case where a voltage of 1 V is applied to the nozzle, the peak electric current was about 1 μA.

In this case, the threshold electric current value may be set to be about 500 nA.

In addition, waiting time from contact detection to making the nozzle disconnected was set to zero, so as to make a coating pattern minimal, however, by increasing the waiting time, the coating pattern can be enlarged.

However, the longer waiting time to increase amount of the semiconductor coating liquid to be supplied to the substrate surface, disturbs a shape of the coating pattern, therefore it is desirable that the waiting time is equal to or shorter than about 0.1 seconds.

Distance for a nozzle to disconnect from the substrate surface after detection of electric current, is set to be 1 mm.

In the case where the concave-convex or the curvature is present on the substrate, in order to avoid contact between the nozzle tip and the substrate in moving the nozzle in an X-Y direction, it is necessary to transfer the nozzle sufficiently larger than about the degree of the size of the concave-convex or the curvature.

A semiconductor after coating has a circular pattern having a diameter of about 400 μm, and correct coating at the center of the gap between the source electrode and the drain electrode, can be carried out, in all of the elements.

By measurement of FET characteristics by connecting the source electrode, the drain electrode and the gate electrode, after drying chloroform, as a solvent, On/Off operation by gate voltage was clearly confirmed, therefore the FET array enabled to be prepared.

Embodiment 2

Description will be given on an example coated by applying voltage between an electrode on a substrate and a nozzle, as other Embodiment.

By measurement of steady-state current flowing through the nozzle, by connecting all of the source electrodes and the drain electrodes on the substrate, and by applying voltage between these electrodes and the nozzle, contact between the droplet and the substrate surface was detected.

When voltage between the electrode and the nozzle is 1 V, steady-state current of about 1 μA flows through the nozzle, during the time when both are contacted via the droplet.

Threshold electric current value is set to be 500 nA to carry out coating operation in the same manner as in Embodiment 1.

As a result, in the same manner as in Embodiment 1, coating with a semiconductor pattern having a diameter of about 400 μm, can be made at correct position, and the FET array can be prepared.

It should be noted that technical matters relevant to the present invention are as follows:

1. A coating apparatus to form a film on a substrate surface facing to the nozzle by supplying a liquid material from a nozzle tip, characterized by coating the liquid material by:
   having a translation mechanism, which is capable of moving the nozzle in an in-plane direction and in a height direction, toward the substrate;
   making the nozzle to come gradually closer to the substrate, after determination of the in-plane position of the nozzle, by the translation mechanism;
   detecting electric current flowing through the nozzle, when a semiconductor droplet supplied from the nozzle tip contacts with an electrode installed at the substrate surface;
   stopping accession of the nozzle, when value of the electric current becomes over threshold value set in advance; and
   making the nozzle tip apart from the substrate by predetermined distance.
2. The coating apparatus according to the above 1, characterized in that the electrode is in an electrically floating state, and transient current flowing between the electrode and the nozzle is used, as the electric current.
3. The coating apparatus according to the above 2, characterized in that voltage is applied to the nozzle.
4. The coating apparatus according to the above 1, characterized in that voltage is applied between the electrode and the nozzle, and steady-state current flowing between the electrode and the nozzle is used, as the electric current.

The present invention can be applied to coat a plastic substrate in a flexible circuit or a flexible display apparatus with an electrode material, a semiconductor material and an insulating material.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of coating by supplying a liquid material from a nozzle tip to form a film on a substrate surface facing to said nozzle, comprising the steps of:
   preparing a translation mechanism, which is capable of moving said nozzle in an in-plane direction of the substrate and in a thickness direction of the substrate, toward said substrate;
   making said nozzle to come gradually closer to said substrate, after position determination of said nozzle at a predetermined position on the in-plane of said substrate, by using said translation mechanism;
   detecting electric current flowing through said nozzle from said substrate surface, when a semiconductor droplet supplied from said nozzle tip contacts with an electrode installed at said substrate surface;
   stopping accession of said nozzle to the substrate, when value of said electric current becomes over threshold value set in advance; and
   making the nozzle tip apart from said substrate farther than in said stopping, so as to coat said substrate with the liquid material.
2. The method of coating according to claim 1, wherein said electrode is in an electrically floating state, and transient current flowing between said electrode and said nozzle is used for detection of said electric current.
3. The method of coating according to claim 2, wherein voltage is applied to said nozzle.
4. The method of coating according to claim 1, wherein predetermined direct voltage or alternate voltage is applied between said electrode and said nozzle, and
   steady-state current flowing between said electrode and said nozzle is used for detection of said electric current.

* * * * *